(12) United States Patent
Park et al.

(10) Patent No.: US 8,598,654 B2
(45) Date of Patent: Dec. 3, 2013

(54) MOSFET DEVICE WITH THICK TRENCH BOTTOM OXIDE

(75) Inventors: Chanho Park, Pleasanton, CA (US); Ashok Challa, Salt Lake City, UT (US); Ritu Sodhi, Maharashtra, IN (US)

(73) Assignee: Fairchild Semiconductor Corporation, South Portland, ME (US)

( * ) Notice: Subject to any disclaimer, the term of this patent is extended or adjusted under 35 U.S.C. 154(b) by 26 days.

(21) Appl. No.: 13/049,629

(22) Filed: Mar. 16, 2011

(65) Prior Publication Data

US 2012/0235230 A1 Sep. 20, 2012

(51) Int. Cl.
*H01L 29/78* (2006.01)
*H01L 21/336* (2006.01)

(52) U.S. Cl.
USPC ........... 257/333; 257/510; 438/268; 438/270; 438/424

(58) Field of Classification Search
USPC ......... 257/331, 330, 329, 327, 288, 213, 335, 257/341; 438/269, 270
See application file for complete search history.

(56) References Cited

U.S. PATENT DOCUMENTS

| | | | |
|---|---|---|---|
| 4,992,390 A | 2/1991 | Chang | |
| 5,126,807 A | 6/1992 | Baba et al. | |
| 5,508,534 A | 4/1996 | Nakamura et al. | |
| 6,037,202 A | 3/2000 | Witek | |
| 6,198,127 B1 | 3/2001 | Kocon | |
| 6,262,439 B1 | 7/2001 | Takeuchi et al. | |
| 6,262,453 B1 | 7/2001 | Hshieh | |
| 6,265,269 B1 | 7/2001 | Chen et al. | |
| 6,274,905 B1 | 8/2001 | Mo | |
| 6,291,298 B1 | 9/2001 | Williams et al. | |
| 6,433,385 B1 | 8/2002 | Kocon et al. | |
| 6,489,652 B1 | 12/2002 | Jeon et al. | |
| 6,580,123 B2 | 6/2003 | Thapar | |
| 6,649,459 B2 | 11/2003 | Deboy et al. | |
| 6,673,681 B2 | 1/2004 | Kocon et al. | |
| 6,690,062 B2 | 2/2004 | Henninger et al. | |
| 6,720,616 B2 | 4/2004 | Hirler et al. | |
| 6,803,626 B2 | 10/2004 | Sapp et al. | |

(Continued)

FOREIGN PATENT DOCUMENTS

EP 1 054 451 A2 11/2000
EP 1 369 927 A2 12/2003

(Continued)

OTHER PUBLICATIONS

Peake, Steven T., et al., "A Fully Realized 'Field Balanced' TrenchMOS Technology", Proceedings of the 20th International Symposium on Power Semiconductor Devices & IC's, May 18-22, 2008, pp. 28-31.

(Continued)

*Primary Examiner* — Walter H Swanson
*Assistant Examiner* — Wilner Jean Baptiste
(74) *Attorney, Agent, or Firm* — Brake Hughes Bellermann LLP

(57) ABSTRACT

In one general aspect, an apparatus can include a first trench oxide disposed within a first trench of an epitaxial layer and having a trench bottom oxide disposed below a gate portion of the first trench oxide. The apparatus can include a second trench disposed lateral to the first trench. The trench bottom oxide portion of the first oxide can have a thickness greater than a distance within the epitaxial layer from the first trench to the second trench.

21 Claims, 6 Drawing Sheets

(56) References Cited

U.S. PATENT DOCUMENTS

| | | |
|---|---|---|
| 6,806,533 B2 | 10/2004 | Henninger et al. |
| 6,809,375 B2 | 10/2004 | Takemori et al. |
| 6,833,584 B2 | 12/2004 | Henninger et al. |
| 6,852,597 B2 | 2/2005 | Park et al. |
| 6,861,296 B2 | 3/2005 | Hurst et al. |
| 6,861,701 B2 | 3/2005 | Williams et al. |
| 6,903,412 B2 | 6/2005 | Darwish et al. |
| 7,015,104 B1 | 3/2006 | Blanchard |
| 7,023,069 B2 | 4/2006 | Blanchard |
| 7,041,560 B2 | 5/2006 | Hshieh |
| 7,199,006 B2 | 4/2007 | Hshieh |
| 7,208,385 B2 | 4/2007 | Hossain et al. |
| 7,232,726 B2 | 6/2007 | Peake et al. |
| 7,291,899 B2 | 11/2007 | Falck et al. |
| 7,319,256 B1 | 1/2008 | Kraft et al. |
| 7,352,036 B2 | 4/2008 | Grebs et al. |
| 7,382,019 B2 | 6/2008 | Merchant et al. |
| 7,485,532 B2 | 2/2009 | Marchant et al. |
| 7,612,408 B2 | 11/2009 | Zundel et al. |
| 7,790,589 B2 | 9/2010 | Eggenkamp et al. |
| 7,910,437 B1 | 3/2011 | Baek et al. |
| 8,299,524 B2 | 10/2012 | Takaishi |
| 2001/0023961 A1 | 9/2001 | Hshieh et al. |
| 2003/0209757 A1 | 11/2003 | Henninger et al. |
| 2004/0089910 A1 | 5/2004 | Hirler et al. |
| 2004/0214397 A1* | 10/2004 | Thapar .......................... 438/270 |
| 2005/0167742 A1 | 8/2005 | Challa et al. |
| 2005/0242392 A1 | 11/2005 | Pattanayak et al. |
| 2006/0019448 A1 | 1/2006 | Darwish et al. |
| 2006/0231915 A1 | 10/2006 | Hshieh et al. |
| 2007/0069324 A1 | 3/2007 | Takaishi |
| 2007/0187695 A1* | 8/2007 | Nakamura et al. ............... 257/77 |
| 2007/0187753 A1* | 8/2007 | Pattanayak et al. ........... 257/330 |
| 2008/0093641 A1 | 4/2008 | Ludikhuize et al. |
| 2008/0173969 A1 | 7/2008 | Hebert et al. |
| 2008/0261358 A1 | 10/2008 | Sonsky |
| 2009/0085107 A1 | 4/2009 | Hshieh |
| 2010/0163950 A1 | 7/2010 | Gladish et al. |

FOREIGN PATENT DOCUMENTS

| | | |
|---|---|---|
| JP | 01192174 A | 8/1989 |
| JP | 1192175 A | 8/1989 |
| JP | 3211885 A | 9/1991 |
| WO | 00/33386 A2 | 6/2000 |
| WO | 00/42665 A1 | 7/2000 |
| WO | 01/45155 A1 | 6/2001 |
| WO | 01/59847 A2 | 8/2001 |
| WO | 01/88997 A2 | 11/2001 |
| WO | 03/023861 A2 | 3/2003 |

OTHER PUBLICATIONS

Kim, Jongdae, et al., "A Novel Process for Fabricating High Density Trench MOSFETs for DC-DC Converters", ETRI Journal, vol. 24, No. 5, Oct. 2002, pp. 333-340.

Rutter, Phil, et al., "Low Voltage TrenchMOS Combining Low Specific RDS(on) and QG FOM", Proceedings of the 22nd International Symposium on Power Semiconductor Devices & ICs, Hiroshima, Jun. 6-10, 2010, pp. 325-328.

Barkhordarian, Vrej, "Power MOSFET Basics", International Rectifier, El Segundo, Ca., Apr. 3, 2003, 13 pages.

* cited by examiner

MOSFET DEVICE WITH THICK TRENCH BOTTOM OXIDE

TECHNICAL FIELD

This description relates to a metal-oxide-semiconductor field-effect transistor (MOSFET) device with a thick trench bottom oxide.

BACKGROUND

As the feature sizes of power metal-oxide-semiconductor field-effect transistor (MOSFET) devices (e.g., low voltage power (MOSFET) devices) are decreased, the channel resistance of the power MOSFET devices can be reduced so that the total on-resistance of the power MOSFET devices is reduced in a desirable fashion. In many of these known power MOSFET devices, further reduction in the total on-resistance can be achieved by reducing resistance within the drift region (referred to as drift resistance), which can become the dominant component of the total on-resistance. Recently, several structures have been proposed and developed to reduce the drift resistance of power MOSFET devices, but they utilize an additional electrode, referred to as a shield electrode, to obtain charge balance in the drift region and reduce the drift resistance. Although the shield electrode can be effective in reducing drift resistance in known power MOSFET devices, the semiconductor processing techniques used to produce a power MOSFET device with a shield electrode can be complicated, expensive, and/or may not be practical in some applications. Thus, a need exists for systems, methods, and apparatus to address the shortfalls of present technology and to provide other new and innovative features.

SUMMARY

In one general aspect, an apparatus can include a first trench oxide disposed within a first trench of an epitaxial layer and having a trench bottom oxide disposed below a gate portion of the first trench oxide. The apparatus can include a second trench disposed lateral to the first trench. The trench bottom oxide portion of the first oxide can have a thickness greater than a distance within the epitaxial layer from the first trench to the second trench.

In another general aspect, an apparatus can include a first trench oxide having a portion disposed below a center portion of a first gate electrode, and a second trench oxide having a portion disposed below a second gate electrode. The apparatus can also include an epitaxial layer having a portion extending from the first trench oxide to the second trench oxide. The portion of the first trench oxide can have a thickness greater than a width of the portion of the epitaxial layer extending from the first trench oxide to the second trench oxide.

In yet another general aspect, a method can include defining a first trench within an epitaxial layer of a semiconductor. The first trench can be aligned along and centered about a longitudinal axis. The method can include defining, within the epitaxial layer, a second trench lateral to the first trench, and forming, within the first trench, a portion of an oxide having a thickness along the longitudinal axis greater than a distance from the first trench to the second trench. The method can also include disposing a gate electrode on the portion of the oxide.

The details of one or more implementations are set forth in the accompanying drawings and the description below. Other features will be apparent from the description and drawings, and from the claims.

DETAILED DESCRIPTION

Figure 1:
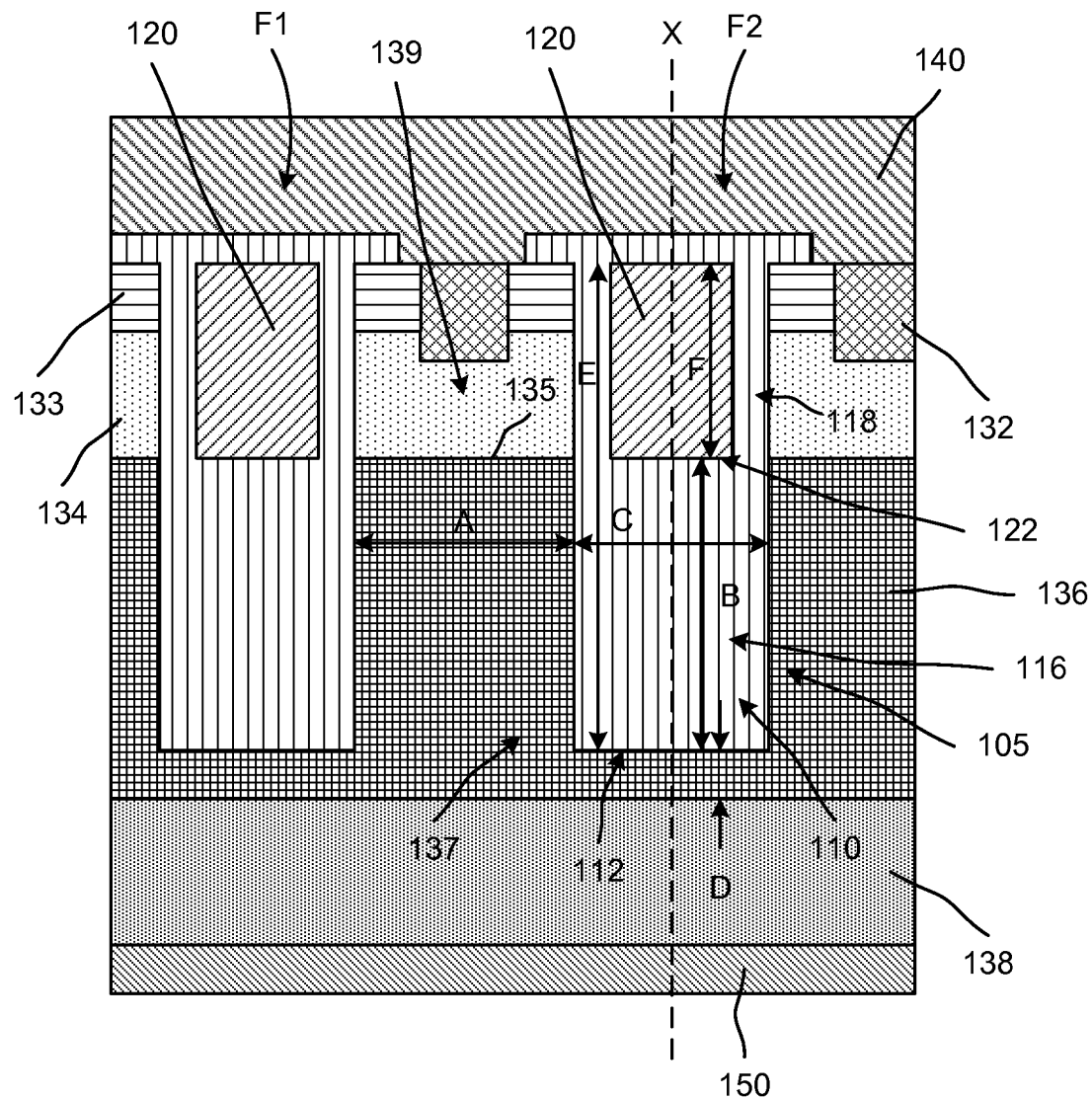
FIG. 1 is a block diagram that illustrates a cross-sectional view of power metal-oxide-semiconductor field-effect transistor (MOSFET) devices with thick trench bottom oxides, according to an embodiment.

FIG. 1 is a block diagram that illustrates a cross-sectional view of power metal-oxide-semiconductor field-effect transistor (MOSFET) devices with thick trench bottom oxides, according to an embodiment. Specifically, FIG. 1 illustrates a MOSFET device F1 and a MOSFET device F2, which are lateral to one another (as oriented within FIG. 1). In the example of FIG. 1, the MOSFET devices F1, F2 have similar features, and therefore the MOSFET devices F1, F2 are generally discussed in terms of a single MOSFET device F2 (that is mirrored in the other MOSFET device F1 and/or mirrored within the MOSFET device F2).

As shown in FIG. 1 an epitaxial layer 136 (e.g., N-type) is disposed over a substrate 138 (e.g., N+ substrate). Source regions 133 (e.g., N+ source regions) and body regions 132 (e.g., heavy body regions, P+ body regions) are formed in body regions 134 (e.g., P-type) which is formed in the epitaxial layer 136. Trench 105 extends through body region 136 and terminates in a drift region 137 within the epitaxial layer 136 (also can be referred to as an epitaxial region) and/or in an N+ substrate 138. Trench 105 includes a trench oxide 110 disposed within the trench 105 and that has a portion 116 (which can be referred to as a trench bottom oxide (TBO) or as a trench bottom oxide portion) below a gate electrode 120 (e.g., below a center portion of the gate electrode 120). The trench oxide 110 includes a gate oxide 118 (also can be referred to as a gate oxide portion). A source electrode 140 can be disposed (e.g., deposited, formed) above the MOSFET devices F1, F2, and a drain contact 150 can be disposed (e.g., deposited, formed) below the substrate 138. The MOSFET devices F2 can be configured to operate (e.g., be activated) by applying a voltage (e.g., a gate voltage, a gate to source voltage) to the gate electrode 120 of the MOSFET device F2, which can turn the MOSFET device F2 on by forming channels adjacent to the gate oxide 118 so that current may flow between the source regions 133 and the drain contact 150.

In some embodiments, the portion 116 of the trench oxide 110 below the gate electrode 120 can be referred to as a trench bottom oxide (TBO). As shown in FIG. 1, the trench bottom oxide 116 can have a thickness B (e.g., an average thickness, a maximum thickness, a minimum thickness) that is greater, less than, or equal to a width A (e.g., an average width, a maximum thickness, a minimum thickness) between the trench 105 of the MOSFET device F1 and the trench 105 of the MOSFET device F2. In some embodiments, the width A can be referred to as a mesa width. In some embodiments, the width A can be measured (e.g., measured as a distance) from the trench 105 (e.g., an edge of the trench) of the MOSFET device F1 to the trench 105 (e.g., an edge of the trench) of the MOSFET device F2. In some embodiments, the portion of the epitaxial layer 136 disposed between the trenches 105 can be referred to as a mesa portion 139. In some embodiments, the thickness B can be referred to as a depth (or as a thickness) of the trench bottom oxide 116.

In some embodiments, the thickness B can be approximately two times the width A. In some embodiments, the thickness B can be more than two times (e.g., 2.1 times, 2.5 times, 3 times, 10 times) the width A, or less than two times (e.g., 1.5 times, 1.1 times, 0.5 times) the width A. In some embodiments, a width C (e.g., an average thickness, a maximum thickness, a minimum thickness) can be less than the width A and/or the thickness B. In some embodiments, the width C can be (e.g., can approximately be) the diameter of the trench 105.

The trench bottom oxide 116 can have a charge (e.g., an interface charge, a trapped charge (that can be defined when the trench bottom oxide is formed)) that can be used to offset (or at least partially offset) a charge within the drift region 137. Accordingly, the relatively thick trench bottom oxide provides charge balance to the drift region 137. As a result, the doping concentration of the drift region 137 can be increased to reduce the on-resistance ($R_{DSon}$) of the MOSFET devices F1, F2 (when a channel is formed adjacent to the gate oxide 118 in response to a voltage applied to the gate electrode 120) while maintaining a relatively high blocking voltage of the MOSFET devices F1, F2. Moreover, the charge in the relatively thick trench bottom oxide 116 can facilitate depletion of the drift region 137 (when the MOSFET devices F1, F2 are deactivated (e.g., turned off, in an off state)). Specifically, the thick trench bottom oxide 116 of the MOSFET devices F1, F2 collectively contribute to complete depletion of the drift region from the trench 105 of the MOSFET device F1 to the trench 105 of the MOSFET device F2. This depletion (e.g., complete depletion) of the drift region 137 can contribute to a desirable blocking voltage (also can be referred to as a breakdown voltage) of the MOSFET devices F1, F2.

An increase in the doping concentration of the drift region 137 (without the charge balancing provided by the trench bottom oxide 116) could be used to produce a desirable on-resistance MOSFET devices F1, F2, but this would typically result in a commensurate decrease in the blocking voltage of the MOSFET devices F1, F2. The presence of the trench bottom oxide 116 for charge balancing within the drift region 137 (to balance the charge associated with the increased doping concentration of the drift region 137) can causes depletion of the drift region 137 (when the MOSFET devices F1, F2 are turned off) that can result in a higher blocking voltage than could be achieved without the charge balancing provided by the trench bottom oxide 116. Thus, the doping concentration of the drift region 137 in the epitaxial layer 136 (and on-resistance) can be higher (with the presence of the trench bottom oxide 116) than would be possible for a given target blocking voltage than would be possible without the trench bottom oxide 116.

Said another way, the trench bottom oxide 116 enables optimization of the doping in the drift region 137 and the thickness of the drift region 137 to obtain a relatively low on-state resistance. Specifically, the relatively thick trench bottom oxide 116 can enable formation of a relatively high doping level in the drift region 137 (and relatively low on-state resistance) while still maintaining a relatively high blocking voltage (also can be referred to as a breakdown voltage) of the MOSFET devices F1, F2. Without the relatively thick trench bottom oxide 116, the blocking voltage of the MOSFET devices F1, F2 would be relatively low with the relatively high doping in the drift region 137. As a specific example, the relatively thick trench bottom oxide 116 can be used to provide charge balance within the MOSFET devices F1, F2, which can improve the breakdown voltages of the MOSFET devices F1, F2 by as much as 6V for a 30V device. In some embodiments, $R_{DSon}$ can be improved by 10 to 30% (via increased doping) because of the charge balancing provided by the thick TBO that allows for increased doping. In addition, the relatively thick trench bottom oxide 116 can also be used to reduce gate to drain capacitance and charge, resulting in an improved $R_{DS} \times Q_{GD}$ (gate charge) figure of merit. More details related to relationships between the trench bottom oxide thickness and breakdown voltage are shown, for example, in connection with FIGS. 2 and 3.

In some embodiments, the charge of the trench bottom oxide 116 can be defined to balance (at least partially balance) the charge in the drift region 137 so that the doping within the drift region 137 can be increased. In some embodiments, the charge density in the trench bottom oxide 116 can be, for example, between 1E10 to 5E12 Coulombs (C)/cm². In some embodiments, the charge density within the trench bottom oxide 116 can be defined using interface charges, trapped charges, and/or so forth.

Figure 6:
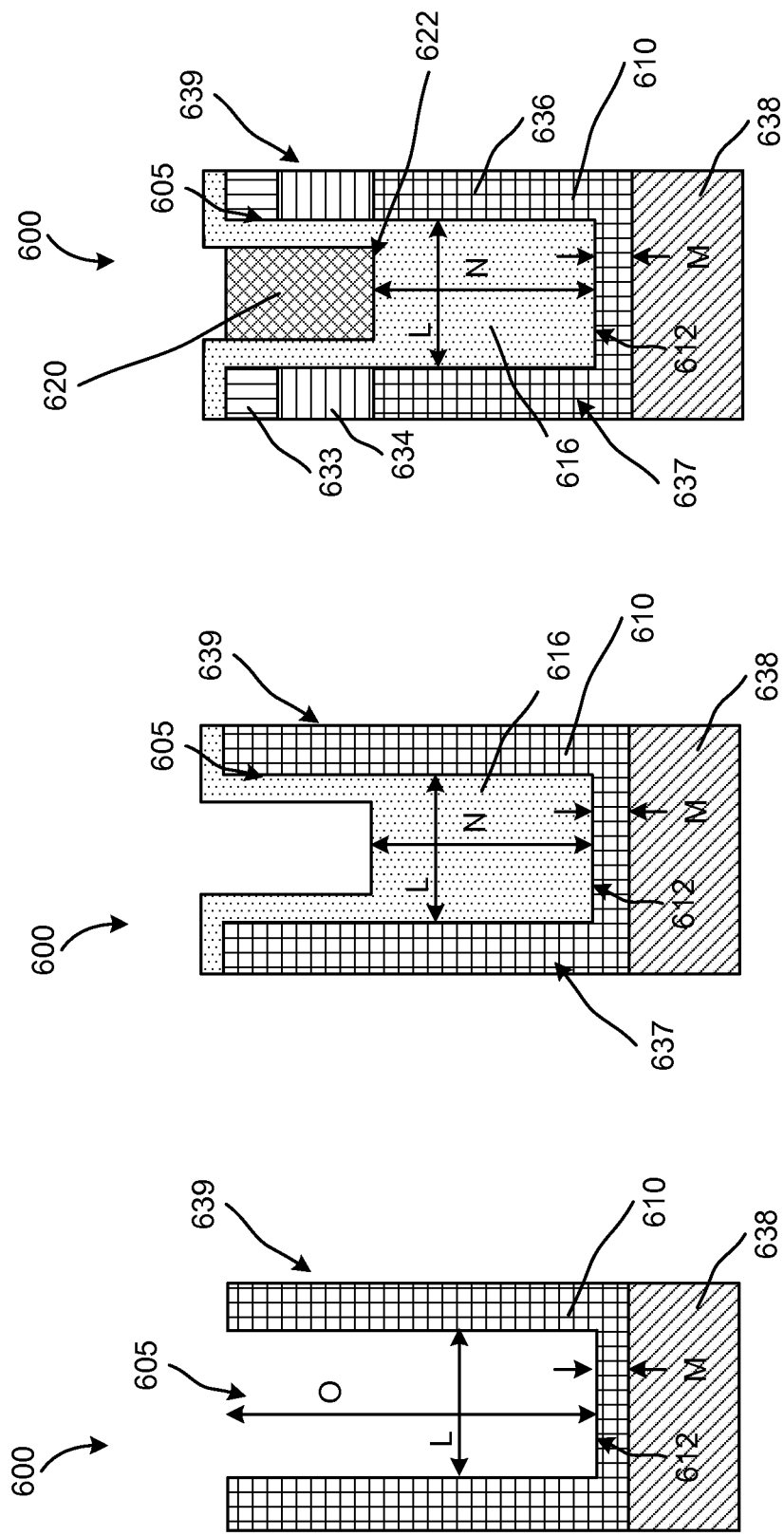
FIGS. 6A through 6C are each cross-sectional diagrams that illustrate a method for producing a power MOSFET device with a thick bottom oxide.

In some embodiments, the relatively thick trench bottom oxide 116 can be formed using a process that doesn't require, for example, the formation of a shield electrode (not shown in FIG. 1). The shield electrode can be a conductive material (e.g., a doped or an undoped polysilicon material, a metal) that is electrically isolated within the trench 105 from the gate electrode 120 and disposed (at least partially) below the gate electrode 120. More details related to the process for forming a relatively thick trench bottom oxide, without a shield electrode, are described in connection with FIGS. 6 and 7.

As shown in FIG. 1, the trench 105 (and the trench bottom oxide 116) are aligned along (e.g., substantially aligned along) a longitudinal axis X. In this embodiment, the trench 105 and the trench bottom oxide 116 are also substantially centered around the longitudinal axis X. The longitudinal axis X can be orthogonal to, or substantially orthogonal to, a plane (or axis) along which the substrate 138 and epitaxial layer 136 are aligned.

In some embodiments, the ratio of the thickness B of the trench bottom oxide 116 to the width A (which can be measured along a distance substantially orthogonal to longitudinal axis X) can be defined based on the portion of the trench bottom oxide 116 that is aligned along the longitudinal axis X and is below the gate oxide 120. In some embodiments, the thickness B can be defined by a bottom surface 122 of the gate electrode 120 and a bottom surface 112 of the trench 105 that are each centered about (e.g., approximately centered about) the longitudinal axis X. Although not shown in FIG. 1, the trench 105 of the MOSFET device F1 can be aligned along a longitudinal axis that is lateral to an parallel to (e.g., substantially parallel to) the longitudinal axis X of the MOSFET device F2.

As shown in FIG. 1, the gate electrode 120 can have a thickness F (also can be referred to as a height) that is less than the thickness B of the trench bottom oxide 116. In some embodiments, the gate electrode 120 can have a width (not shown) that is less than the thickness B of the trench bottom oxide 116. In some embodiments, the thickness F of the gate electrode 120 can be less than a width C (e.g., an average width, a diameter) of the trench 105 (or the portion 116 of the trench oxide 110).

In some embodiments, the thickness B of the trench bottom oxide 116 is less than or equal to half (e.g., 0.3 times) of the overall depth E of the trench 105. In some embodiments, the thickness B the trench bottom oxide 116 is greater than half (e.g., 0.7 times, 1.5 times, 2 times, 3 times, 10 times) of the overall depth E of the trench 105.

As shown in FIG. 1, in some embodiments, the bottom surface 112 of the trench 105 can be disposed above the substrate 138. In such embodiments, the bottom surface 112 of the trench 105 (and the trench bottom oxide 116) can be disposed within the epitaxial layer 136. Thus, the epitaxial layer 136 can have a thickness D below the bottom surface 112 of the trench 105. Although not shown, in some embodiments, the bottom surface 112 of the trench 105 (and at least a portion of the trench bottom oxide 116) can extend into the substrate 138. In other words, the bottom surface 112 the trench 105 can be disposed within the substrate 138. In such embodiments, the trench bottom oxide 116 can span both the epitaxial layer 136 and at least a portion of the substrate 138.

As shown in FIG. 1, at least a portion of the bottom surface 122 of the gate electrode 120 is approximately aligned with a junction 135 (e.g., a PN junction) defined by (e.g., defined by an interface of) the epitaxial layer 136 and the body regions 134. In some embodiments, the junction 135 can be substantially contiguous and linear (without breaks or curved portions) between the trenches 105 of the MOSFET devices F1, F2. The junction 135 can be orthogonal to (or substantially orthogonal to) the longitudinal axis X along which the trench 105 (and the trench bottom oxide 116) can be aligned.

In some embodiments, the MOSFET devices F1, F2 and other MOSFET devices (not shown) similar to MOSFET devices F1, F2 can be included in one or more discrete components. In such embodiments, the MOSFET devices F1, F2 and the other MOSFET devices (not shown) can collectively function as a single MOSFET device.

As shown in FIG. 1, MOSFET devices F1, F2 can be included in (e.g., integrated into), for example, a computing device (not shown). In some embodiments, the computing device can be, for example, a computer, a personal digital assistant (PDA), a memory component (e.g., a hard disk drive), a host computer, an electronic measurement device, a data analysis device, a cell phone, a power supply, an automotive electronic circuit, an electronic device, and/or so forth. In some embodiments, the MOSFET devices F1, F2 can be used in a variety of application such as switches that connect power supplies to electronic devices having a load.

Although the MOSFET devices F1, F2 described in connection with FIG. 1 are N-type MOSFET devices, the principles described herein can be implemented in P-type MOSFET devices. For example, the conductivity type (N-type and P-type) can be reversed accordingly for p-channel devices.

Figures 2, 3:
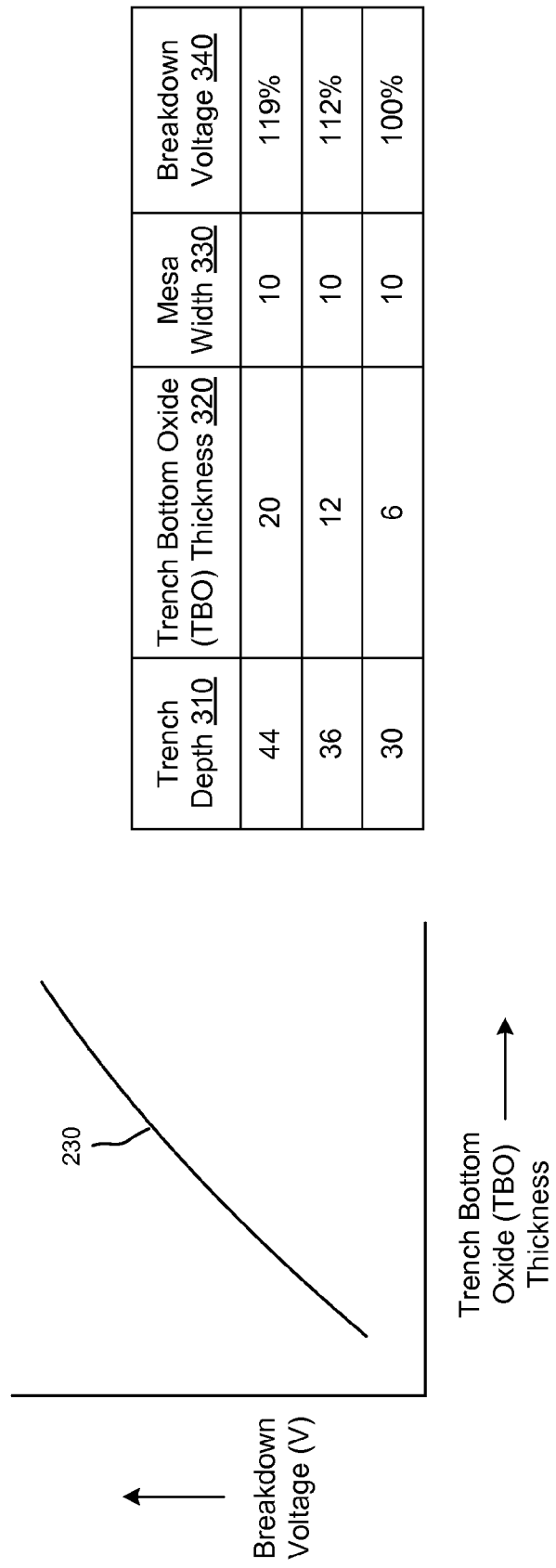
FIG. 2 is a graph that illustrates a breakdown voltage of a power MOSFET device versus a trench bottom oxide (TBO) thickness.
FIG. 3 is a table that illustrates relationships between feature sizes of a power MOSFET device and breakdown voltage of the power MOSFET device.

FIG. 2 is a graph that illustrates a breakdown voltage of a power MOSFET device versus a trench bottom oxide (TBO) thickness. In some embodiments, the power MOSFET can be similar to the power MOSFET devices shown in FIG. 1. The relationship 230 shown in FIG. 2 assumes a specified (e.g., a constant) mesa width, a specified (e.g., a constant) drift region thickness (i.e., height), and a specified (e.g., constant) gate electrode size.

As shown in FIG. 2, the breakdown voltage of the MOSFET device increases with an increase in TBO thickness. In this embodiment, as the TBO thickness (e.g., height) increases, the overall thickness (e.g., height) of the trench of the MOSFET device also increases. The breakdown voltage can also be referred to as a blocking voltage, and can be the breakdown voltage of the MOSFET device when the MOSFET device is off (e.g., when a gate voltage to form a channel is not applied to the gate electrode). The increase in the breakdown voltage is proportional to the increased TBO thickness because the increased TBO thickness causes depletion of the drift region of the MOSFET device (which directly results in the increased blocking voltage of the MOSFET device). In some embodiments, the TBO thickness can be increased for a given trench depth when a size (e.g., a height or thickness) of a gate electrode over the TBO thickness is decreased.

Although not shown in FIG. 2, in some embodiments, the increase in the breakdown voltage of the MOSFET device can saturate when a bottom of the trench reaches the substrate (e.g., N+ substrate). Specifically, the breakdown voltage of the substrate may not continue to increase as the bottom of the trench extends into the substrate of the semiconductor even though the TBO thickness may continue to increase and the overall depth of the trench continues to increase. In some embodiments, the breakdown voltage of the MOSFET device may saturate when a thickness of the trench oxide is approximately 2.5 times greater than a mesa width between the MOSFET device and another MOSFET device.

FIG. 3 is a table that illustrates relationships between feature sizes of a power MOSFET device and breakdown voltage of the power MOSFET device. The table illustrates relative trench depth 310, trench bottom oxide (TBO) thickness 320, mesa width 330, and breakdown voltage 340. In this embodiment, the trench depth 310 and TBO thickness 320 are normalized to the mesa width 330. The breakdown voltage 340 decrease is shown as an increase from 100%. The table shown in FIG. 3 is based on a constant mesa width 330 of 10 and a constant doping level in the epitaxial layer (e.g., the drift region of the epitaxial layer). Although not shown, the table shown in FIG. 3 can be based on a constant pitch (from the center of one MOSFET device to the center of an adjacent MOSFTET device) that is larger than the mesa width 330.

As shown in FIG. 3, the breakdown voltage 340 of the power MOSFET device increases with increasing trench depth 310, which is increasing with the TBO thickness 320. Specifically, when the trench depth 310 increases from 36 to 44 (a total of 8), the trench bottom oxide thickness 320 also increases approximately 8 from 12 to 20. As shown in FIG. 3, the corresponding increase in breakdown voltage 340 with the 8 increase in trench bottom oxide thickness 320 is approximately 7%. In some embodiments, the increase in breakdown voltage can be approximately 0.5 V per 0.1 μm increase in trench bottom oxide thickness 320.

Although not shown, in some MOSFET devices, the increase in breakdown voltage can be greater than 0.5 V per 0.1 μm increase in trench bottom oxide thickness. In some MOSFET devices, the increase in breakdown voltage can be less than or equal to 0.5 V per 0.1 μm increase in trench bottom oxide thickness. In such embodiments, the increase in breakdown voltage per trench bottom oxide thickness increase can depend on the charge density of the trench bottom oxide, the mesa width, drift region dopant levels, and/or so forth.

For example, a trench bottom oxide that has a relatively high charge density may result in a larger breakdown voltage increase per unit increase in trench bottom oxide thickness than a trench bottom oxide that has a relatively low charge density. Similarly, a relatively small mesa width and/or a relatively low dopant level within the drift region may result in a larger breakdown voltage increase per unit increase in trench bottom oxide thickness than a trench bottom oxide that has a relatively large mesa width and/or a relatively high dopant level within the drift region.

Figure 4:
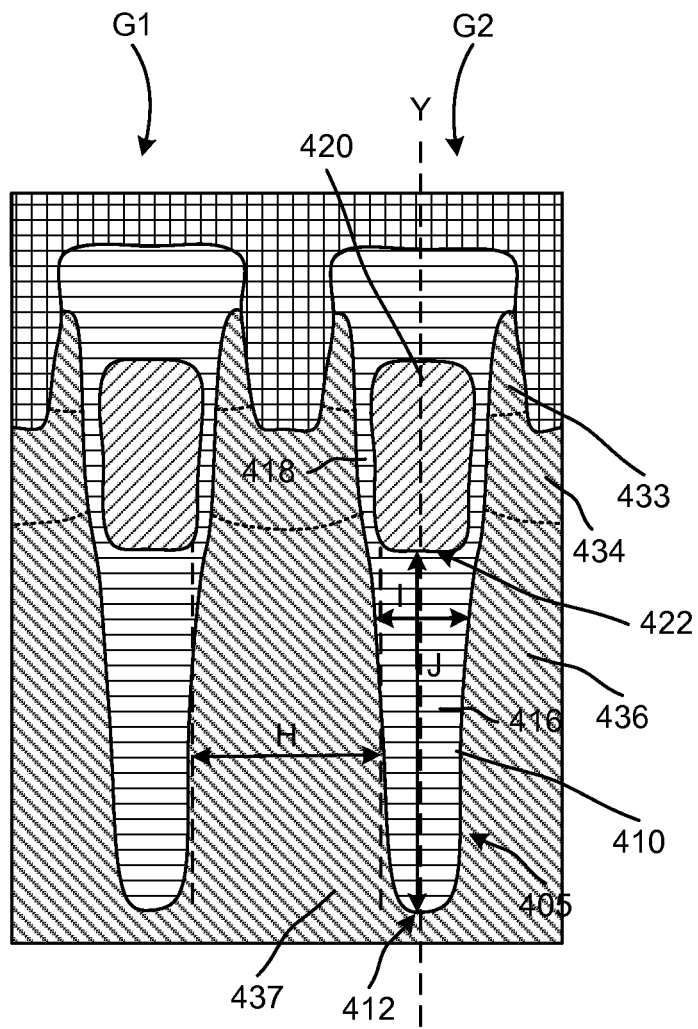
FIG. 4 is a cross-sectional diagram that illustrates power MOSFET devices with thick trench bottom oxides, according to an embodiment.

FIG. 4 is a cross-sectional diagram that illustrates power MOSFET devices with thick trench bottom oxides, according to an embodiment. Specifically, FIG. 4 illustrates a MOSFET device G1 and a MOSFET device G2. Because the MOSFET devices G1, G2 have similar features, the MOSFET devices G1, G2 will generally be discussed in terms of a single MOSFET device G2 (that is mirrored in the other MOSFET device G1 and/or mirrored within the MOSFET device G2).

As shown in FIG. 4 the MOSFET devices G1, G2 are formed within an epitaxial layer 436 (e.g., N-type). Source regions 433 (e.g., N+ source regions) are disposed above body regions 434 (e.g., P-type) which is formed in the epitaxial layer 436. Trench 405 extends through body region 436 and terminates in a drift region 437 within the epitaxial layer 436 (also can be referred to as an epitaxial region). Trench 405 includes a trench oxide 410 disposed within the trench 405 and that has a portion 416 below a gate electrode 420 (e.g., below a center portion of the gate electrode 420). The trench oxide 410 includes a gate oxide 418 (also can be referred to as a gate oxide portion). The MOSFET devices G1, G2 can be configured to operate by applying a voltage (e.g., a gate voltage) to the gate electrodes 420 of the MOSFET devices G1, G2, which can turn the MOSFET devices G1, G2 on by forming channels adjacent to the gate oxides 418 so that current may flow between the source regions 433 and a drain contact (not shown).

In some embodiments, the portion 416 of the trench oxide 410 below the gate electrode 420 can be referred to as a trench bottom oxide (TBO). As shown in FIG. 4, the trench bottom oxide 416 can have a thickness J that is greater, less than, or equal to a width H between the trench 405 of the MOSFET device G1 and the trench 405 of the MOSFET device G2. In this embodiment, because the sidewalls of the trenches 405 of MOSFET devices G1, G2 are tapered (e.g., not vertical, sloped), the width H is an average width between the TBO portions of the trenches 405 between the MOSFET devices G1, G2. Because of the tapering of the MOSFET device G1, G2 a width I of the trench bottom oxide 416 decreases along a longitudinal axis Y from the gate electrode 420 toward a bottom surface 412 of the trench 405. Because of the tapering of the MOSFET device G1, G2, the width I can be an average width of the trenches 405 of the MOSFET devices G1, G2. In some embodiments, the width H can be referred to as a mesa width. In some embodiments, the thickness J can be referred to as a depth (or as a thickness) of the trench bottom oxide 416. In some embodiments, the thickness J can be approximately two times the width H.

As shown in FIG. 4, the trench 405 (and the trench bottom oxide 416) are aligned along (e.g., substantially aligned along) the longitudinal axis Y. In this embodiment, the trench 405 and the trench bottom oxide 416 are also substantially centered about the longitudinal axis Y. In some embodiments, the ratio of the thickness J of the trench bottom oxide 416 to the width H can be defined based on the portion of the trench bottom oxide 416 that is aligned along a longitudinal axis Y and is below the gate oxide 420. In some embodiments, the thickness J can be defined by a bottom surface 422 of the gate electrode 420 and a bottom surface 412 of the trench 405 that are each centered about (e.g., approximately centered about) the longitudinal axis Y.

Figure 5:
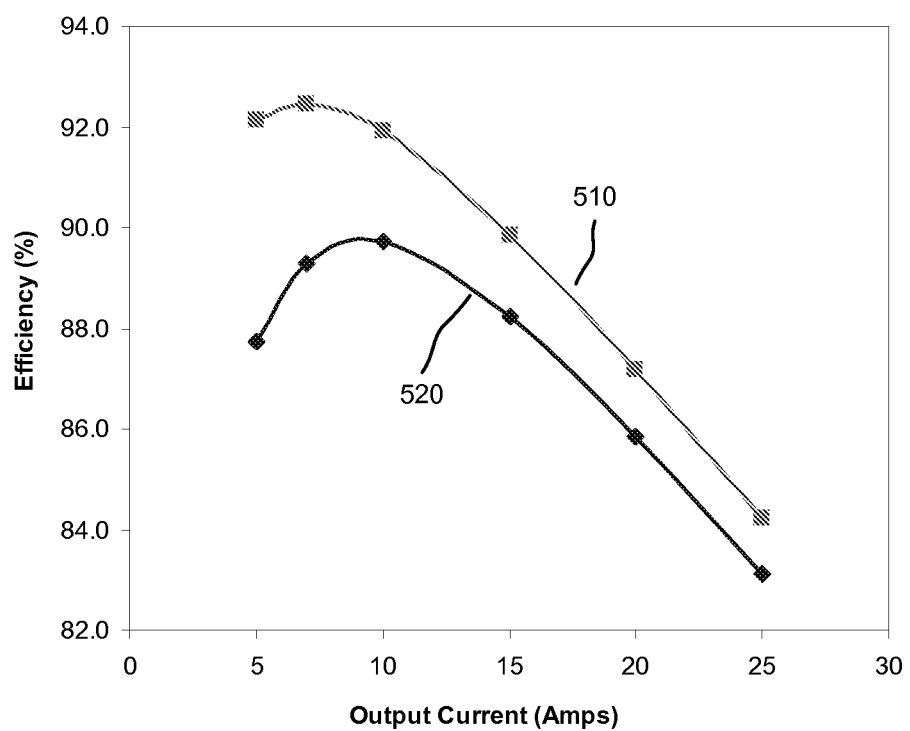
FIG. 5 is a graph that illustrates an efficiency of a power MOSFET device with a thick TBO compared with an efficiency of a power MOSFET device with a shielded electrode.

FIG. 5 is a graph that illustrates an efficiency 510 of a power MOSFET device with a thick TBO compared with an efficiency 520 of a power MOSFET device with a shielded electrode. The power MOSFET device with the thick TBO excludes (i.e., does not have) a shield electrode. In some embodiments, a shield electrode (e.g., a relatively small shield electrode, a relatively low profile or thin shield electrode adjacent to a thick TBO) can be used in conjunction with the thick TBO described herein. A percent efficiency is shown on a y-axis of the graph and an output current (in Amperes (A)) is shown on the x-axis.

The percent efficiencies shown in the graph are related to efficiencies of the MOSFET devices when used within a DC to DC converter (i.e., a switched-mode power supply configured to step-down a DC voltage as a buck converter). Thus, the efficiencies illustrate power losses related to the MOSFET devices when used within the DC to DC converters.

As shown in FIG. 5, the efficiency 510 of the MOSFET device with the thick TBO is higher than the efficiency 520 of the MOSFET device with the shield electrode. Specifically, the efficiency 510 of the MOSFET device with the thick TBO decreases with increasing output current, but the efficiency 510 of the MOSFET device with the thick TBO is higher than the efficiency 520 of the MOSFET device with the shield electrode over the entire range of the results shown in FIG. 5.

The difference in efficiency between the MOSFET device with the thick TBO and the MOSFET device with the shield electrode is related to the difference in output capacitance of these two MOSFET devices. The shield electrode of the MOSFET device has (e.g., results in) an output capacitance (e.g., a shield electrode capacitance, a source to drain capacitance) which is between the shield electrode and the surrounding epitaxial layer around the shield electrode. This output capacitance directly reduces the efficiency 510 of the MOSFET device with the shield electrode. Because the MOSFET device with the thick TBO does not include a shield electrode, the efficiency 520 of the MOSFET device does not suffer from the output capacitance issues (e.g., efficiency losses) caused by the shield electrode. Accordingly, the efficiency 510 of the MOSFET device with the thick TBO is higher than the efficiency 520 of the MOSFET device with the shield electrode.

FIGS. 6A through 6C are cross-sectional diagrams that illustrate a method for producing a power MOSFET device 600 with a thick bottom oxide. In FIGS. 6A through 6C, various operations (e.g., semiconductor processing operations) are performed within an epitaxial layer 610, which is disposed on a substrate 638, to form the MOSFET device 600 (and other MOSFET devices lateral to the MOSFET device 600). The conductivity types described in these figures can be reversed to make a p-channel MOSFET device with a thick bottom oxide.

FIGS. 6A through 6C are simplified diagrams that illustrates only some of the steps that may be required to produce a MOSFET device with a thick bottom oxide. In some embodiments, additional semiconductor processing operations (e.g., masking steps, etching steps, deposition steps, polishing steps) can be used to produce the MOSFET device with the thick bottom oxide. In some embodiments, a die can have many MOSFET devices (which can be laterally oriented with respect to one another) with thick trench bottom oxides similar to that shown in FIGS. 6A through 6C, dispersed throughout the active region of the die in a predefined pattern. For simplicity, numerals are shown on only one side of the MOSFET device 600 in FIGS. 6A through 6C.

FIG. 6A, which illustrates a cross section of the MOSFET device 600 being fabricated, includes a substrate 638, an epitaxial (P-type) layer 610, a trench 605 and a mesa portion 639 (which extends between MOSFET device 600 and other MOSFET devices that aren't shown). The substrate 638 can be an N-type wafer which has been previously scribed with a laser to include information that can be used to identify the die (e.g., device type, lot number, wafer number). In some embodiments, the substrate 638 can also be a highly doped N+ substrate.

In some embodiments, the epitaxial layer 610, which is formed over the substrate 638, can be a P-type material made of the same conductivity or different conductivity than the substrate 638. In some embodiments, although not shown, a lightly doped N-type epitaxial layer can be disposed between substrate 638 and the epitaxial layer 610. In some embodiments, the epitaxial layer 610 can be made of lightly doped P-type material. In some embodiments, the semiconductor region (where the MOSFET devices are formed) can be the epitaxial layer 610 formed (e.g., defined, deposited) over the substrate 638.

In some embodiments, the epitaxial layer 610 can be epitaxially grown on the substrate 638. In some embodiments, the dopant concentration within the epitaxial layer 610 may not be uniform. In particular, the epitaxial layer 610 can have a lower dopant concentration in a lower portion and a higher dopant concentration in an upper portion, or vice versa. In some embodiments, the epitaxial layer 610 can have a concentration gradient throughout its depth with a lower concentration at, or near, the interface with the substrate 638 and a higher concentration near or at the upper surface, or vice versa. In some embodiments, the concentration gradient along the length of the epitaxial layer 610 can be monotonically decreasing concentration and/or discretely or a stepwise decreasing concentration. The concentration gradient can also be obtained by using multiple epitaxial layers (i.e. two or more) where each epitaxial layer can include a different dopant concentration.

The trench 605 can be formed within the epitaxial layer 610 through a series of masking steps (e.g., photoresist masking, photoresist stripping), etching steps, and/or so forth. In some embodiments, the trench 605 can be formed using an etching process that can include gaseous etchants such as, for example, $SF_6/He/O_2$ chemistries. This etching process also can define the mesa region 639 which can be disposed from trench 605 of the MOSFET device 600 to another trench (similar to trench 605) of another MOSFET device (not shown). Thus, the mesa region 639 can be defined by a pair of trenches (similar to trench 605). In some embodiments, the mesa region 639 can have a width that can range approximately between 0.1 microns (μm) to 10 μm (e.g., 0.2 μm, 0.5 μm, 1 μm). In some embodiments, the etching process used to define the trench 605 can be a selective etching process.

In some embodiments, the epitaxial layer 610 can be etched until the trench 605 has a predetermined depth O and width L in the epitaxial layer 610. In some embodiments, a bottom surface 612 of the trench 605 can be a distance M from a top surface of the substrate 638. In some embodiments, the distance M can range approximately between 0.1 μm to 10 μm (e.g., 0.2 μm, 0.5 μm, 1 μm). In some embodiments, the distance M can be less than or equal to the depth O and/or the width L. In some embodiments, the distance M can be greater than the depth O and/or the width L. Although not shown in FIGS. 6A through 6C, the trench 605 can have a predetermined depth and/or width within the substrate 638. In some embodiments, the trench 605 can be etched to a depth O ranging approximately between 0.5 μm to 100 μm (e.g., 1 μm, 2 μm, 5 μm, 50 μm). The depth O of the trench 605 can be defined so that an oxide 616 (shown in FIGS. 6B and 6C) that is formed (e.g., deposited) within the trench 605 can have a thickness N (shown in FIGS. 6B and 6C) that is greater than (e.g., at least two times) the width of the mesa region 639 between the trench 605 and another trench (not shown).

In some embodiments, the depth O and width L aspect ratio of the trench 605 can be controlled so that the later formed (e.g., deposited) oxide 616 fills the trench 605 without the formation of undesirable voids. In some embodiments, the aspect ratio of the trench can be range approximately 1:1 to about 1:50.

In some embodiments, the sidewall of the trench 605 (which defines at least a portion of the mesa region 639) may not be perpendicular to the top surface of the epitaxial layer 610. Instead, the angle of the trench 605 sidewalls can range from about 60 degrees relative to the top surface of the epitaxial layer 610 to about 90 degrees (i.e. a vertical sidewall) relative to the top surface of the epitaxial layer 610. The trench angle can also be controlled so that a later deposited oxide layer (or other material) can fill in the trench 605 without (substantially without) forming undesirable voids.

As shown in FIG. 6B, the oxide 616, which can be thermally grown and/or deposited, can have a thickness N. In some embodiments, the thickness N of the oxide 616 can include a gate oxide formed over a thermally grown and/or deposited oxide within the trench 605. In some embodiments, the thermally grown and/or deposited oxide within the trench 605 (and below the gate oxide) can be etched (e.g., isotropically etched) before the gate oxide is formed over the thermally grown and/or deposited oxide. In such embodiments, the thickness of the thermally grown and/or deposited oxide, before being etched can be greater than the thickness N, and when the gate oxide is formed, the final thickness N of the oxide 616 can include the gate oxide thickness. In some embodiments, at least a portion of the oxide 616 (e.g., a non-gate oxide portion, a gate oxide portion) can be formed using a chemical vapor deposition (SACVD) process (e.g., a sub-atmospheric CVD process) (which can desirable coverage and/or a void free oxide 616). In some embodiments, other types of deposition processes can be used.

In some embodiments, a reflow process can be used to reflow the dielectric material (i.e., oxide 616), which can reduce voids or defects within the oxide 616. In some embodiments, an etch process can be used to remove the excess oxide 616. In some embodiments, a planarization process, such as a chemical and/or mechanical polishing process, can be used in addition to (whether before or after), or instead of, the etch process. In some embodiments, the dielectric material can be any insulating or semi-insulating materials, for example, oxides and/or nitrides. Although not shown, in some embodiments, the oxide 616 can be also etched back so that its top surface is below the top surface of the epitaxial layer 610. In some embodiments, the oxide 616 can be formed by depositing an oxide material until it overflows the trench 605 (as shown in FIG. 6B).

In some embodiments, the charge density of the oxide 616 that can be configured to balance at least a portion of the charge within the drift region 637. In some embodiments, the charge density of the oxide 616 can vary vertically along the thickness N to facilitate the charge balance action of the oxide 616 in the drift region 637. For example, the charge density of the oxide 616 can either increase or decrease (with a gradient)

along the thickness N gradually or as a step-function. In some embodiments, the charge density of the oxide 616 can vary horizontally (with a gradient) along the width L to facilitate the charge balance action of the oxide 616 in the drift region 637. For example, the charge density of the oxide 616 can either increase from the center of the trench 605 towards the outer edges of oxide 616 or decrease from the center of the trench 605 towards the outer edges of oxide 616 gradually or as a step-function.

As shown in FIG. 6C, a gate electrode 620 is deposited over the oxide 616 (e.g., a gate oxide that defines a top portion of the oxide 616). In some embodiments, the gate electrode 620 can be a conductive and/or a semiconductive material, such as, for example, a metal, silicide, semiconducting material, doped polysilicon, and/or combinations thereof. In some embodiments, the gate electrode 620 can be formed by a deposition process such as, for example, CVD, plasma-enhanced CVD (PECVD), low pressure CVD (LPCVD), and/or sputtering processes using a metal as a sputtering target. In some embodiments the gate electrode 240 can be deposited so that it fills and overflows over the upper part of the trench 605. In some embodiments, the shape of the gate electrode 240 can be formed by removing the upper portion of the gate electrode 240 using, for example, an etch-back process. In some embodiments, the gate electrode 240 can be formed so that its upper surface is substantially planar with the upper surface of the epitaxial layer 610 as shown in FIG. 6C.

As illustrated by FIGS. 6A through 6C a shield electrode is not disposed within the oxide 616. Thus, at least some semiconductor processing steps associated with formation of a shield electrode may be not performed (e.g., substantially may not be performed). For example, additional etching of the oxide 616 and deposition process steps to deposit a shield electrode may not be performed. In addition, formation of a dielectric layer between a shield electrode (if included) and the gate electrode 620 may not be performed. Also, processing steps required to electrically coupled (e.g., connect) the shield electrode with one or more contact regions (e.g., source contact regions) of the MOSFET device 600 may not be performed.

As shown in FIG. 6C, source regions 633 (e.g., N+ source regions) and body regions 634 (e.g., P-type) are formed within the epitaxial layer 610. Although not shown, heavy body regions (e.g., P+ body regions) can also be formed within the epitaxial layer 610. The source regions 633, the body regions 634, and/or the heavy body regions, can be formed using implantation and/or drive processes. For example, in some embodiments, the body regions 634 can be formed by implanting a p-type dopant in the upper surface of the epitaxial layer 610 and then driving-in the dopant.

Although not shown, an insulating layer (e.g., an overlying insulating layer) can be formed over the gate electrode 620, which can be used to cover the top surface of the gate electrode 620. In some embodiments, the insulating layer can be a dielectric material including borophosphosilicate glass (BPSG), phosphosilicate glass (PSG), or borosilicate glass (BSG) materials. In some embodiments, the insulating layer can be deposited using a CVD process until the desired thickness is obtained. In some embodiments, the insulating layer can be reflowed.

Although not shown, one or more contact regions (e.g., contact portions) can be formed for contacting one or more portions of the MOSFET device 600. In some embodiments, a drain can be formed on the bottom of the substrate 638. In some embodiments, the drain can be formed before or after one or more contact regions are formed above the MOSFET device 600. In some embodiments, the drain can be formed on the backside by thinning the backside of the substrate 638 using processes such as grinding, polishing, and/or etching. In some embodiments, a conductive layer can be deposited on the backside of the substrate 638 until the desired thickness of the conductive layer of the drain is formed.

In some embodiments, one or more types of semiconductor substrates can be used to produce the MOSFET device 600 shown in FIGS. 6A through 6C. Some examples of substrates that can be used include, but are not limited to, silicon wafers, epitaxial Si layers, bonded wafers such as used in silicon-on-insulator (SOI) technologies, and/or amorphous silicon layers, all of which may be doped or undoped. Also, in some embodiments, other semiconductor materials that can be used can include SiGe, Ge, Si, SiC, GaAs, GaN, $In_xGa_yAs_z$, $Al_xGa_yAs_z$, $Al_xGa_yN_z$, and/or so forth.

Figure 7:
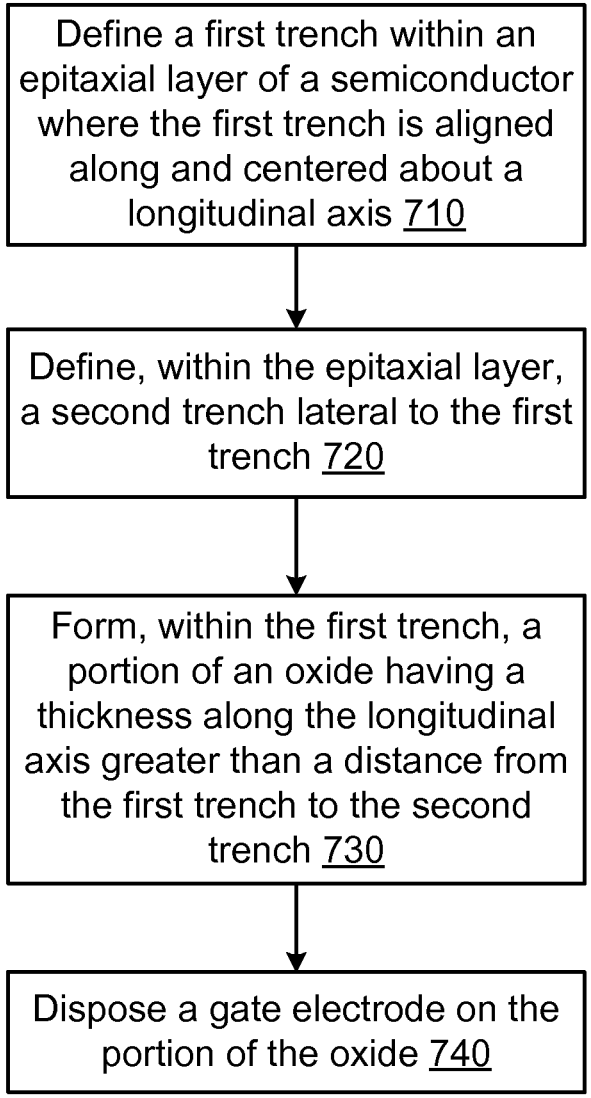
FIG. 7 is a flowchart that illustrates a method for producing a power MOSFET device.

FIG. 7 is a flowchart that illustrates a method for producing a power MOSFET device. This method can be used to form (e.g., define) one or more of the power MOSFET devices described above (e.g., MOSFET device F2 shown in FIG. 1, MOSFET device G2 shown in FIG. 4).

As shown in FIG. 7, a first trench is defined within an epitaxial layer of a semiconductor where the first trench being aligned along a longitudinal axis (block 710). In some embodiments, the first trench can be centered about the longitudinal axis. The first trench can be defined (e.g., formed) by etching a cavity into the epitaxial layer of the semiconductor after the epitaxial layer has been formed (e.g., disposed) on a substrate of the semiconductor. In some embodiments, the first trench can be formed using various semiconductor processing steps such as masking, stripping, etc.

A second trench lateral to the first trench is defined within the epitaxial layer (block 720). In some embodiments, the second trench can be aligned along a longitudinal axis that is parallel to and lateral to the longitudinal axis of the first trench.

A portion of an oxide having a thickness along the longitudinal axis greater than a distance from the first trench to the second trench is formed within the first trench (block 730). In some embodiments, the oxide can be referred to as a trench oxide, and the portion of the oxide can be referred to as a thick bottom oxide. In some embodiments, the portion of the oxide can be formed (e.g., defined, deposit) using one or more semiconductor processing techniques such as deposition techniques and/or thermal growth techniques. Although not shown, in some embodiments, a portion of an oxide having a thickness that is greater than the distance from the first trench to the second trench can also be formed within the second trench.

In some embodiments, the thickness of the portion of the oxide can be defined so that the portion of the oxide has a charge density that can cause complete depletion within an epitaxial layer disposed between the first trench and the second trench when a MOSFET device associated with the first trench any MOSFET device associated with the second trench are in an off state. In some embodiments, the thickness of the portion of the oxide can be defined so that a portion of the oxide has a charge density that at least partially offsets a charge within an epitaxial layer disposed between the first trench in the second trench. In some embodiments, the thickness portion of the oxide can be defined so that a doping level (e.g., doping concentration) within an epitaxial layer disposed between the first trench and the second trench can be relatively high without affecting a breakdown voltage of a MOSFET device associated with the first trench in an undesirable fashion.

A gate electrode is disposed on the portion of the oxide (block 740). In some embodiments, the gate electrode is at least partially disposed on the portion of the oxide. In some embodiments, the gate electrode can be disposed on the portion of the oxide using one or more semiconductor processing techniques. In some embodiments, the gate electrode can be made of a polysilicon material. In some embodiments the portion of the oxide can be a trench bottom oxide, and the gate electrode can be disposed lateral to another portion of the oxide that functions as a gate oxide. In some embodiments, the portion of the oxide and the gate electrode may not be formed without a shield electrode. In other words, a MOSFET device associated with the first trench, when processing the MOSFET device is completed, can exclude a shield electrode.

Implementations of the various techniques described herein may be implemented in digital electronic circuitry, or in computer hardware, firmware, software, or in combinations of them. Some implementations may be implemented using various semiconductor processing and/or packaging techniques. As discussed above, some embodiments may be implemented using various types of semiconductor processing techniques associated with semiconductor substrates including, but not limited to, for example, Silicon (Si), Gallium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An apparatus, comprising:
a substrate;
an epitaxial layer disposed on the substrate;
a first trench within the epitaxial layer;
a trench oxide disposed within the first trench and having a trench bottom oxide portion disposed below a gate portion of the trench oxide, the trench bottom oxide excluding a shield electrode; and
a second trench disposed lateral to the first trench, the trench bottom oxide of the trench oxide having a thickness greater than a distance within the epitaxial layer between the first trench and the second trench, the epitaxial layer having a portion disposed between a bottom surface of the first trench and the substrate.

2. The apparatus of claim 1, wherein the second trench includes a trench oxide having a trench bottom oxide portion, the trench bottom oxide portion of the trench oxide of the first trench and the trench bottom oxide portion of the trench oxide of the second trench collectively have a charge density configured to deplete the epitaxial layer along an entirety of the distance when the apparatus is in an off state.

3. The apparatus of claim 1, wherein the first trench defines at least a portion of a metal-oxide-semiconductor field effect transistor (MOSFET) device, and the epitaxial layer is depleted along an entirety of the distance between the first trench and the second trench when the MOSFET device is in an off state.

4. The apparatus of claim 1, wherein the thickness of the trench bottom oxide portion of the trench oxide is more than two times the distance between the first trench and the second trench.

5. The apparatus of claim 1, further comprising:
a gate electrode disposed within the first trench above the trench bottom oxide portion and substantially lateral to the gate portion of the trench oxide; and
a drain contact disposed below the first trench and the second trench.

6. The apparatus of claim 1, wherein the epitaxial layer has a first conductivity type,
the apparatus further comprising:
a gate electrode disposed within the first trench above the trench bottom oxide portion and substantially lateral to the gate portion of the trench oxide; and
a body region disposed above the epitaxial layer and disposed between the gate portion of the trench oxide disposed within the first trench and a gate portion of a trench oxide disposed within the second trench, the body region having a second conductivity type different from the first conductivity type, the body region configured to convey current from the body region to the epitaxial layer when a channel is formed in the body region in response to a voltage being applied to the gate electrode.

7. The apparatus of claim 1, wherein the trench bottom oxide portion has an output capacitance that is smaller than a gate capacitance if the trench bottom oxide portion includes a shield electrode.

8. The apparatus of claim 1, further comprising:
a gate electrode disposed within the trench, gate electrode having a portion with a substantially flat bottom surface, the thickness of the trench oxide is approximately between the bottom surface of the gate electrode and the bottom surface of the trench oxide.

9. An apparatus, comprising:
a substrate;
a first trench including a first trench oxide having a portion disposed below a center portion of a first gate electrode, the first trench oxide excluding a shield electrode;
a second trench including a second trench oxide having a portion disposed below a second gate electrode; and
an epitaxial layer disposed on the substrate and having a portion extending from the first trench oxide to the second trench oxide, the portion of the first trench oxide having a thickness greater than a width of the portion of the epitaxial layer extending from the first trench oxide to the second trench oxide, the epitaxial layer having a portion disposed between a portion of a bottom surface of the first trench and the substrate.

10. The apparatus of claim 9, further comprising:
a body region disposed between the first trench oxide and the second trench oxide; and
a junction defined by an interface of the epitaxial layer and the body region, the second trench oxide being aligned along an axis substantially orthogonal to the junction.

11. The apparatus of claim 9, wherein the thickness of the portion of the first trench oxide is between a bottom surface of the gate electrode and a bottom surface of the portion of the first trench oxide, the first gate electrode has a portion with a substantially flat bottom surface.

12. The apparatus of claim 9, wherein the thickness of the portion of the first trench oxide is more than two times the width of the portion of the epitaxial layer.

13. The apparatus of claim 9, wherein the thickness of the first trench oxide is less than three times the width of the portion of the epitaxial layer.

14. The apparatus of claim 9, wherein the portion of the first trench oxide is configured to offset a charge within the portion of the epitaxial layer.

15. The apparatus of claim 9, wherein the epitaxial layer has a first conductivity type, the apparatus further comprising:
a body region disposed above the epitaxial layer and disposed between the first gate electrode and the second gate electrode, the body region having a second conductivity type, the body region configured to convey current from the body region to the epitaxial layer when a channel is formed in the body region in response to the first gate electrode being activated.

16. An apparatus, comprising:
a substrate;
an epitaxial layer disposed on the substrate;
a first trench disposed in the epitaxial layer and including a trench bottom oxide having a portion disposed below a center portion of a gate electrode disposed within the first trench, the trench bottom oxide excluding a shield electrode; and
a second trench lined with a trench oxide,
the epitaxial layer defining
a mesa disposed between the first trench and the second trench, the trench bottom oxide included in the first trench having a thickness greater than a width of the mesa extending between the first trench to the second trench, the epitaxial layer having a portion disposed between a bottom surface of the first trench and the substrate.

17. The apparatus of claim 16, wherein the second trench includes a trench bottom oxide, the trench bottom oxide of the first trench and the trench bottom oxide of the second trench collectively have a charge density configured to deplete the mesa along an entirety of the width.

18. The apparatus of claim 16, wherein the first trench defines at least a portion of a first MOSFET device, and the mesa is depleted along an entirety of the width when the MOSFET device is in an off state.

19. The apparatus of claim 16, wherein the thickness of the trench bottom oxide of the first trench is more than two times the width of the mesa.

20. The apparatus of claim 16, wherein the gate electrode is disposed within the first trench above the trench bottom oxide and substantially lateral to a gate portion of the first trench the apparatus, further comprising:
a drain contact disposed below the first trench and the second trench.

21. The apparatus of claim 16, wherein the gate electrode has a portion with a substantially flat bottom surface, the thickness of the trench bottom oxide is approximately between the bottom surface of the gate electrode and the bottom surface of the first trench.

\* \* \* \* \*